(12) United States Patent
Fu

(10) Patent No.: US 11,096,264 B1
(45) Date of Patent: Aug. 17, 2021

(54) INTELLIGENT WALL PANEL SWITCH

(71) Applicant: SHENZHEN MANKA IOT ELECTRONICS CO., LTD., Shenzhen (CN)

(72) Inventor: Pan Fu, Jinan (CN)

(73) Assignee: SHENZHEN MANKA IOT ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 17/138,961

(22) Filed: Dec. 31, 2020

(51) Int. Cl.
　　*H05B 47/10* (2020.01)
　　*H05B 47/17* (2020.01)
　　*H05B 47/19* (2020.01)
　　*H05K 5/00* (2006.01)
　　*H02J 7/00* (2006.01)

(52) U.S. Cl.
　　CPC ............. *H05B 47/19* (2020.01); *H05B 47/17* (2020.01); *H05K 5/0043* (2013.01); *H02J 7/00304* (2020.01); *H05K 5/0073* (2013.01)

(58) Field of Classification Search
　　CPC ........ H05B 47/10; H05B 47/17; H05B 47/19; H05B 45/37; H05B 45/3725; H05K 5/0043; H05K 5/007
　　See application file for complete search history.

(56) References Cited

U.S. PATENT DOCUMENTS

| | | | | |
|---|---|---|---|---|
| 2011/0036699 | A1* | 2/2011 | Daffin, III | H01H 43/10 200/38 A |
| 2014/0262713 | A1* | 9/2014 | Kudla | H05B 47/10 200/331 |
| 2015/0077021 | A1* | 3/2015 | Smith | H01H 9/54 315/362 |
| 2018/0139824 | A1* | 5/2018 | Lin | H05B 45/10 |

* cited by examiner

*Primary Examiner* — Thai Pham

(57) ABSTRACT

The present invention relates to the technical field of intelligent switches, and discloses an intelligent wall panel switch which can preset scene modes and is simple in operation, including a switch body and a controller arranged within the switch body, wherein the controller includes a single live wire power obtaining function module, a power management module, a Bluetooth module and a function key input module. The single live wire power obtaining function module is used for obtaining a voltage source input by a phase line, the power management module is used for receiving a stepped-down voltage, and the Bluetooth module is used for receiving a regulated voltage. The Bluetooth module establishes a wireless communication connection with LED lamps for receiving instruction information input by operation keys. The Bluetooth module correspondingly adjusts the scene mode of the LED lamps according to the instruction information.

15 Claims, 6 Drawing Sheets

INTELLIGENT WALL PANEL SWITCH

FIELD OF THE PRESENT INVENTION

The present invention relates to the technical field of intelligent switches, and more particularly to an intelligent wall panel switch.

DESCRIPTION OF RELATED ART

Intelligent lighting refers to a distributed lighting control system which is composed of technologies, such as Internet of Things Technology, Wired/Wireless Communication Technology, Power Carrier Communication Technology, Embedded Computer Intelligent Information Processing Technology, and Energy Saving Control Technology, for realizing an intelligent control of the lighting devices. In recent years, intelligent lighting has not only been widely used in cities and public lighting, but also has developed rapidly in household lightings, for example intelligent homes. However, most of the existing panel switches are triac dimmer panel switches, which only have functions of turning on the lights, turning off the lights and adjusting brightness of the lights. They can only be used for traditional triac dimmer lights, which is not convenient for meeting a multiple-scenes switching requirements, such as switching between lighting, reading, entertainment and dining scenes, and the linear effect of light dimming is poor, resulting in poor user experience. Therefore, how to improve comfortability of household lightings has become an urgent technical problem to be solved for those skilled in the art.

SUMMARY OF THE PRESENT INVENTION

The technical problem to be solved of the present invention is to provide an intelligent wall panel switch that can preset scene modes and is easy to operate, aiming to overcome the defects in the prior art that most of the existing panel switches are silicon controlled dimming panel switches which only have functions of turning on lights, turning off the lights and adjusting brightness of the lights, and can only be used for traditional silicon controlled dimming lights which is not convenient for users to adjust multiple scenes, and their linear effect of light dimming is poor.

The technical solution adopted by the present invention to solve the technical problem is to provide an intelligent wall panel switch which includes a switch body, a plurality of operation keys arranged on the switch body, and a controller arranged within the switch body, wherein the controller includes a single live wire power obtaining function module, a power management module, a Bluetooth module and a function key input module;

the single live wire power obtaining function module is used for obtaining a voltage source input by a phase line and stepping down the voltage source;

an input terminal of the power management module is coupled to an output terminal of the single live wire power obtaining function module for receiving the stepped-down voltage, stabilizing and outputting the stepped-down voltage;

a power input terminal of the Bluetooth module is coupled to an output terminal of the power management module for receiving a regulated voltage, wherein the Bluetooth module establishes a wireless communication connection with LED lamps;

a signal input terminal of the Bluetooth module is connected to an output terminal of the function key input module for receiving instruction information input by the operation keys; the Bluetooth module correspondingly adjusts scene mode of the LED lamps according to the instruction information.

In some embodiments, a rotary switch is provided at a front end of the switch body, and the rotary switch is electrically connected to the controller. When the rotary switch is rotated, the controller controls a switching of different parameters according to adjustment instructions of the rotary switch.

In some embodiments, the different parameters include at least one of light intensity, color adjustment, and RGB switching.

In some embodiments, a fixing holder is further provided within the switch body, and the rotary switch is fixed on the PCB through the fixing holder.

In some embodiments, keys are also provided at a front end of the switch body, and the keys are one-position switches, two-position switches or multi-position switches.

In some embodiments, a key switch is further provided at an upper end of the switch body, and the key switch is electrically connected to the single live wire power obtaining function module. When the key switch is turned off, the switch body is in a disconnected state.

In some embodiments, a panel fixing frame is provided on an opening side of the switch body; the panel fixing frame is detachably connected to the switch body.

In some embodiments, locating lugs are provided at the corresponding opposite ends of the panel fixing frame, and the panel fixing frame fixes the switch body on the wall through locating lugs and screws.

In some embodiments, the single live wire power obtaining function module includes a first field effect transistor, a second field effect transistor and a drive module;

a drain electrode of the first field effect transistor is connected to an input terminal of the phase line, a source electrode of the second field effect transistor is coupled to a source electrode of the first field effect transistor, gate electrodes of the first field effect transistor and the second field effect transistor are respectively connected to a gate electrode controlling terminal of the drive module;

a drain electrode of the second field effect transistor is coupled to a drain electrode controlling terminal of the drive module.

In some embodiments, the first field effect transistor is connected to the gate electrode controlling terminal of the drive module through a third resistance;

the second field effect transistor is connected to the gate electrode controlling terminal of the drive module through a fourth resistance.

In some embodiments, the first field effect transistor and the second field effect transistor are N-channel depletion MOS transistors.

In some embodiments, the power management module includes a lithium battery protecting chip, a third field effect transistor and a fourth field effect transistor, a power input terminal of the lithium battery protecting chip and a source electrode of the fourth field effect transistor are connected to an output terminal of the single live wire power obtaining function module, an output terminal of the lithium battery protecting chip is coupled to a gate electrode of the third field effect transistor, a drain electrode of the third field effect transistor is coupled to a gate electrode of the fourth field effect transistor, and a drain electrode of the fourth field effect transistor is connected to a power input terminal of the Bluetooth module.

In some embodiments, the power management module further includes a seventh capacitance, wherein one end of the seventh capacitance is coupled to a source electrode of the third field effect transistor, the other end of the seventh capacitance is connected to the power input end of the lithium battery protecting chip.

In some embodiments, the third field effect transistor is an N-channel enhancement type MOS transistor, the fourth field effect transistor is an N-channel depletion MOS transistor.

In some embodiments, a Bluetooth module of the LED lamps wirelessly communicates with an external device, and the scene mode of the LED lamps can be correspondingly adjusted through the external device.

In the present invention, the intelligent wall panel switch includes a switch body and a controller arranged within the switch body, wherein the controller includes a single live wire power obtaining function module, a power management module, a Bluetooth module and a function key input module. The Bluetooth module establishes a wireless communication connection with LED lamps. A signal input terminal of the Bluetooth module is connected with an output terminal of the function key input module for receiving instruction information input by the operation keys, and the Bluetooth module adjusts the scene mode of the LED lamps according to the instruction information. Compared with the prior art, by using a single live wire for power supply, on the one hand, the traditional panel switch circuit wire can be used without re-pulling and modifying and the installation is simple and convenient; on the other hand, the panel switch is provided with a separate key controlling switch, so a switching of the scene modes of the LED lamps can be controlled by the panel switch together with APP; a switching of the lighting scene is simple and convenient, and the scene parameter adjustment is accurate and the adaptability is high.

BRIEF DESCRIPTION OF THE DRAWINGS

The present invention will be further described below in combination with the accompanying drawings and specific embodiments.

DETAILED DESCRIPTION OF THE EXEMPLARY EMBODIMENT

Figure 1:
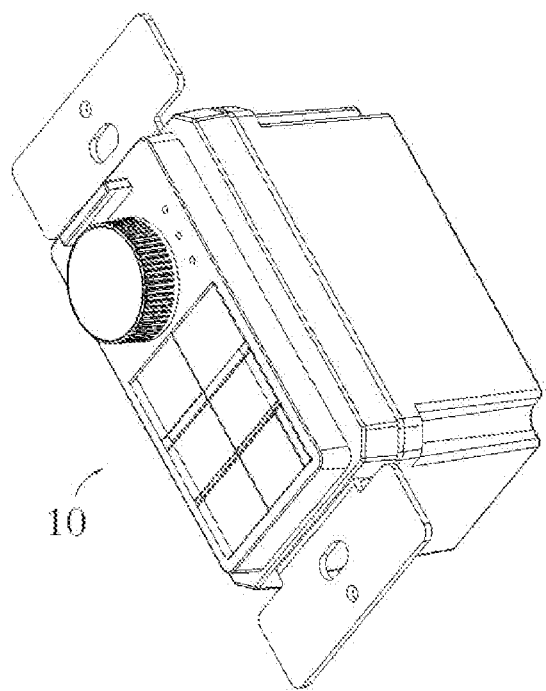
FIG. 1 is a perspective view of an embodiment of an intelligent wall panel switch according to the present invention.
Figure 2:
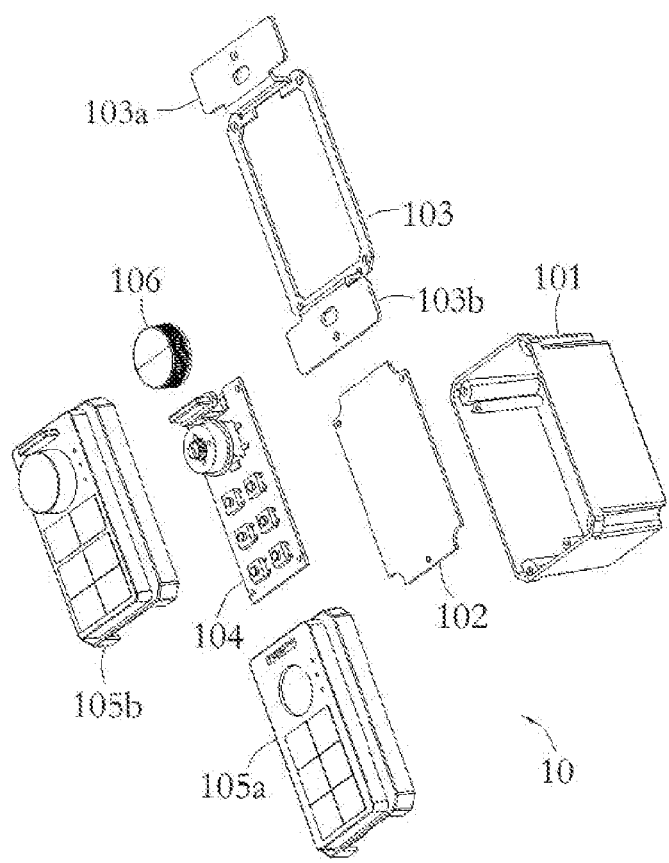
FIG. 2 is an exploded view of the embodiment of the intelligent wall panel switch according to the present invention.
Figure 3:
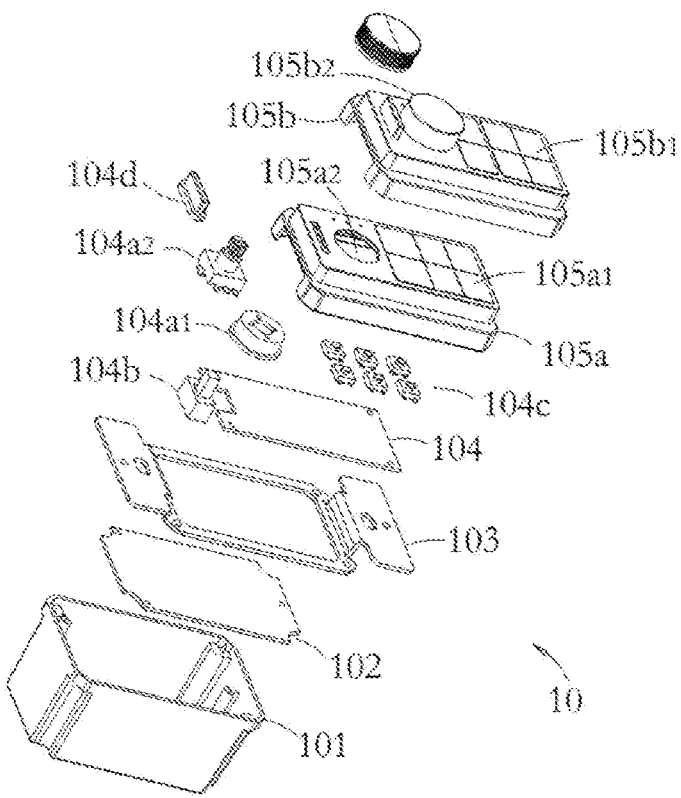
FIG. 3 is an exploded view of another embodiment of the intelligent wall panel switch according to the present invention.

In order to have a clear understanding of the technical features, objectives and effects of the present invention, the specific embodiments of the present invention will be described in detail with reference to the accompanying drawings.

As shown in FIG. 1 to FIG. 9, in the first embodiment of an intelligent wall panel switch provided by the present invention, the intelligent wall panel switch includes a switch body 10, wherein the switch body 10 includes a panel lower cover 101, a power board 102, a panel fixing frame 103, a PCB 104 and two panel upper covers 105a-105b.

Specifically, the panel lower cover 101 is formed as a cuboid with a hollow structure, and one side of the panel lower cover 101 is configured as an opening structure. The power board 102 (corresponding to a controller in FIG. 4) and the panel fixing frame 103 are arranged at the opening of the panel lower cover 101, wherein the power board 102 is fixed at the opening of the panel lower cover 101 through screws. The PCB 104 is arranged above the power board 102, and the PCB 104 is arranged on the panel fixing frame 103.

The panel fixing frame 103 is used for fixing the entire switch body 10 on the wall. Specifically, the panel fixing frame 103 is in a rectangular annular shape, whose edges are connected to the panel lower cover 101, the power board 102, and the PCB board 104, etc., by means of screws, buckles, and so on. There are locating lugs 103a-103b protruding from opposite sides of the rectangular annular shape at the corresponding opposite sides of the panel fixing frame 103, and the switch body 10 can be fixed on the wall through the locating lugs 103a-103b and the screws.

The rotary switch 104a2, the keys 104c, the key switch 104d can be welded on the PCB 104.

Keys 104c are arranged at the middle and lower sections of the PCB 104, and the keys 104c are correspondingly configured as ON key, OFF key, entertainment key, reading key, dining key, and timing key, etc.

A rotary switch 104a2 is arranged at the upper end of the keys 104c (corresponding to the upper end of the ON key and the OFF key), wherein the rotary switch 104a2 is welded on the PCB 104 passing through a fixing holder 104a1.

Furthermore, a key switch 104d is arranged at the upper end of the rotary switch 104a2 for controlling the power ON and OFF of the power board 102.

The keys 104c or the key switch 104d is one-position switches, two-position switches or multi-position switches.

Panel upper covers 105a-105b are arranged on the keys side of the PCB 104, and surfaces of the panel upper covers 105a-105b are provided with key separators (corresponding to 105a1 and 105b1) and knob caps (corresponding to inner cover 105b1 and outer cover 106) corresponding to the rotary switch 104a2 and keys 104c.

Specifically, a through-hole 105a2 is formed on the panel upper covers 105a-105b, and the rotary switch 104a2 extends to the outside through the through-hole 105a2. The knob cap (corresponding to the inner cover 105b1 and the outer cover 106) is sleeved on a knob stem of the rotary switch 104a2. To select different parameters, the rotary switch 104a2 can be rotated through the knob caps (corresponding to the inner cover 105b1 and the outer cover 106), thus to output an adjustment instruction, and the switching of different parameter adjustments are controlled by the power board 102.

Figure 4:
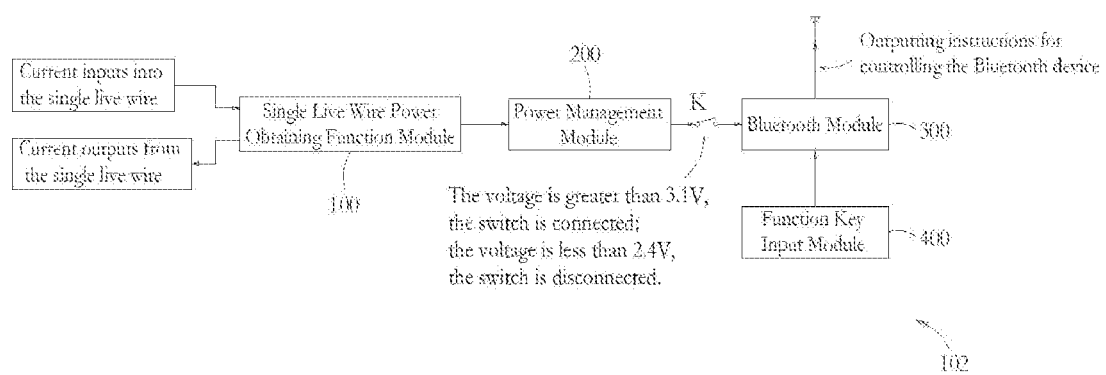
FIG. 4 is a schematic structural view of the embodiment of a controller according to the present invention.

As shown in FIG. 4, the controller 102 (corresponding to the power board 102 in the switch body 10) includes a single live wire power obtaining function module 100, a power management module 200, a Bluetooth module 300 and a function key input module 400.

The single live wire power obtaining function module 100 is used for obtaining a voltage source input by a phase line (corresponding to L1 in FIG. 5), performing a step-down process on the voltage source and then outputting to the power management module 200.

An input terminal of the power management module 200 is coupled to an output terminal of the single live wire power obtaining function module 100 for receiving the step-down voltage (for example, 12V), stabilizing the step-down voltage and outputting another voltage (for example, 3.3V) to the Bluetooth module 300.

The Bluetooth module 300 is used for short range wireless communication to achieve data transmission or instruction transmission. A power input terminal of the Bluetooth module 300 is coupled to an output terminal of the power management module 200 for receiving a regulated voltage (for example, 3.3V). The Bluetooth module 300 also communicates with a Bluetooth module of LED lamps to establish a wireless communication transmitting channel.

Furthermore, a signal input terminal of the Bluetooth module 300 is connected to an output terminal of the function key input module 400 for receiving the instruction information input by the operation keys (corresponding to the rotary switch 104a2 and the keys 104c, etc.), and then the Bluetooth module 300 correspondingly adjusts the scene mode of LED lamps according to the input instruction information.

By using a single live wire for power supply in the present technical solution, when installing the panel switch, on one hand, the traditional panel switch circuit wire can be used without re-pulling and modifying, and the installation is simple and convenient; on the other hand, the panel switch is provided with a separate key controlling switch, so a switching of the scene mode of LED lamps can be controlled by the panel switch together with APP of portable devices, for example, mobile phones, the switching of lighting scene is simple and convenient, the scene parameter adjustment is accurate and the adaptability is high.

In some embodiments, in order to achieve multiple application scenarios of the LED lamps, the rotary switch 104a2 can be electrically connected to the controller 102. When in use, users can turn the rotary switch 104a2 to output an adjustment instruction, and the controller 102 controls the switching of different parameters according to the adjustment instructions.

It should be noted that the different parameters include at least one of light intensity, color adjustment, and RGB switching. For example, after a key switch 104d is pressed, the rotary switch 104a2 can be turned left and right to adjust the light intensity or color of the LED lamps, or to perform RGB switching.

Figure 5:
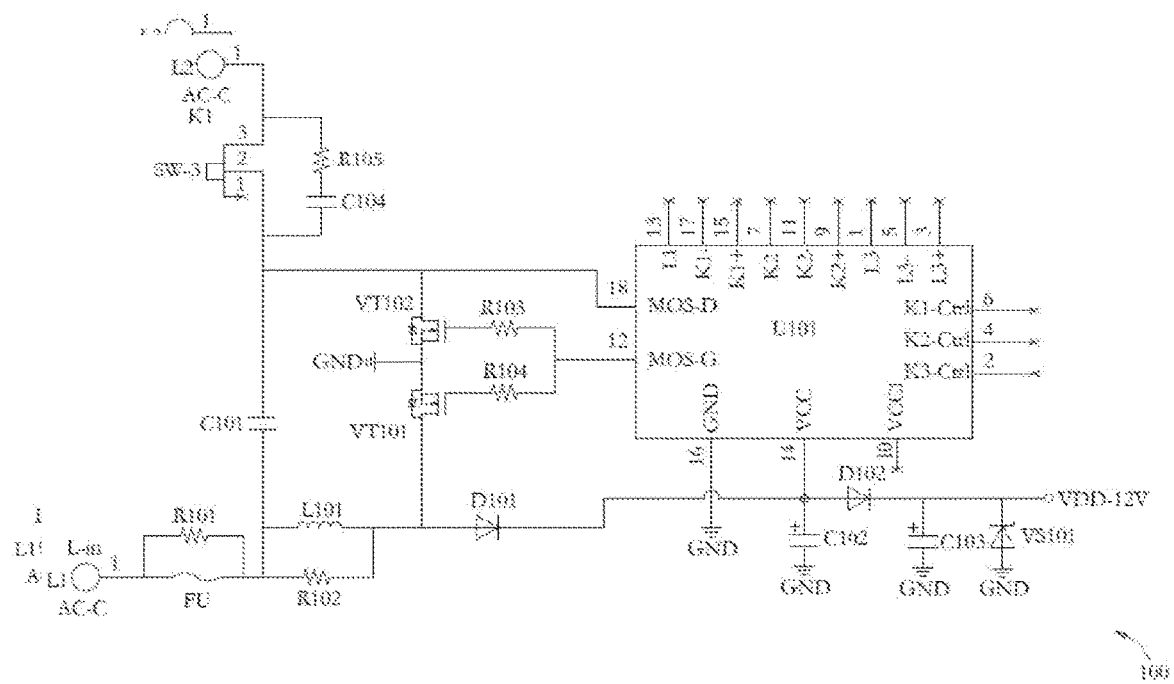
FIG. 5 is a schematic circuit view of the embodiment of a single live wire power obtaining function module according to the present invention.
Figure 6:
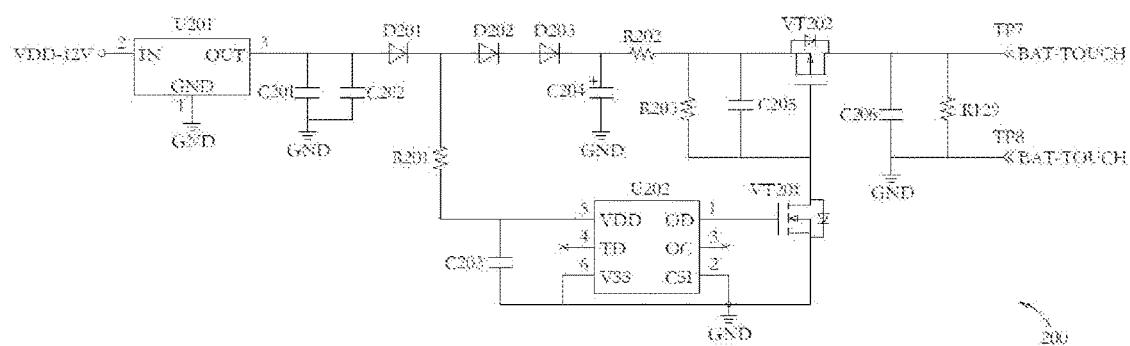
FIG. 6 is a schematic circuit view of the embodiment of a power management module according to the present invention.
Figure 7:
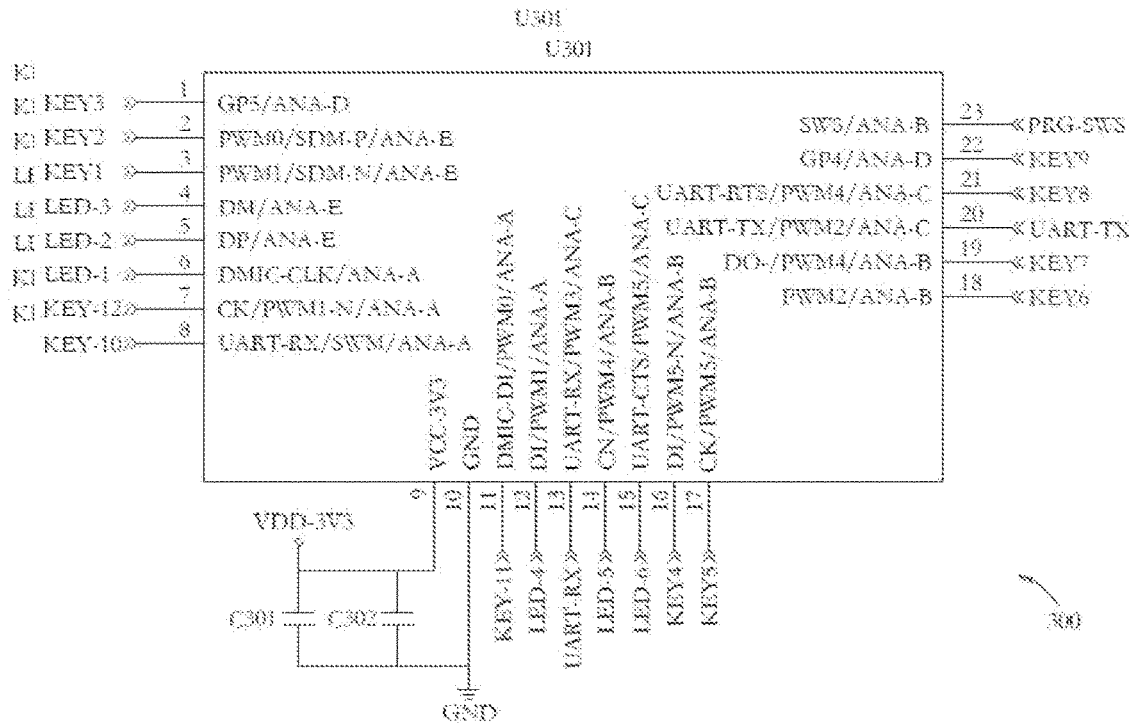
FIG. 7 is a schematic circuit view of the embodiment of a Bluetooth module according to the present invention.

In some embodiments, in order to improve the convenience for using the panel switch, the key switch 104d (corresponding to SW-3) can be provided on the switch body 10. As shown in FIG. 5, the key switch SW-3 is electrically connected to the single live wire power obtaining function module 100 through a first resistance R101 and a first capacitance C101 connected in series. When the key switch SW-3 is disconnected, the switch body 10 is in a disconnected state.

In some embodiments, in order to improve the performance of the single live wire power obtaining function module 100, as shown in FIG. 5, a first diode D101, a first field effect transistor VT101, a second field effect transistor VT102 and a drive module U101 are provided within the single live wire power obtaining function module 100.

The first field effect transistor VT101 and the second field effect transistor VT102 are both N-channel depletion-type MOS transistors, which function as switches.

The drive module U101 is used for controlling ON or OFF of the first field effect transistor VT101 and the second field effect transistor VT102.

Specifically, an input terminal of a phase line (corresponding to L1) is connected to a drain electrode of the first field effect transistor VT101 through the first inductor L101 and the second resistance R102 connected in parallel.

A source electrode of the second field effect transistor VT102 is coupled to a source electrode of the first field effect transistor VT101, and the connecting terminal is connected with a common terminal.

Furthermore, gate electrodes of the first field effect transistor VT101 and the second field effect transistor VT102 are respectively connected to a gate control terminal of the drive module U101. Specifically, the first field effect transistor is connected to the gate control terminal of the drive module U101 through a fourth resistance R104, and the second field effect transistor VT102 is connected to the gate control terminal of the drive module U101 through a third resistance R103.

A drain electrode of the second field effect transistor VT102 is coupled to a drain control terminal of the drive module U101.

When the gate control terminal of the drive module U101 outputs a high level, the first field effect transistor VT101 and the second field effect transistor VT102 are triggered to turn on. When the gate control terminal of the drive module U101 outputs a low level, the first field effect transistor VT101 and the second field effect transistor VT102 are switched from ON to OFF.

Furthermore, an output side of the single live wire power obtaining function module 100 is also provided with a second capacitance C102, a second diode D102, a third capacitance C103, and a voltage Zener diode VS101. The second capacitance C102, the third capacitance C103 and the voltage Zener diode VS101 are connected in parallel. One end of the second capacitance C102 is connected to an anode of the second diode D102, and cathodes of the second diode D102 are respectively connected to one end of the third capacitance C103 and a cathode of the voltage Zener diode VS101. A voltage of 12V is output after the voltage output by the live wire power obtaining function module 100 is filtered and stabilized by the third capacitance C103 and the voltage Zener diode VS101.

In some embodiments, in order to improve the safety of the operation of the power management module 200, a three-terminal Zener diode U201, a lithium battery protecting chip U202, a third field effect transistor VT201, and a fourth field effect transistor can be provided within the power management module 200.

The three-terminal Zener diode U201 can stabilize the input voltage of 12V and output it as a voltage of 3.3V.

The lithium battery protecting chip U202 is used for controlling a charging overcurrent of the lithium battery and a maximum output overcurrent value of the lithium battery. When a charging and discharging range of the lithium battery falls within a voltage threshold of the lithium battery, and at an upper end of the threshold, the switch is connected, so the switch is turned on and the lithium battery discharges. When the charging and discharging range of the lithium battery falls within the voltage threshold of the lithium battery, and at a lower end of the threshold, the switch is turned off, and the power management module 200 charges the lithium battery.

Specifically, as shown in FIG. 4, when a voltage of the switch K is greater than 3.1V, the switch K is connected, and the power management module 200 outputs power to subsequent circuits. When a voltage of the switch K is less than 2.4V, the switch K is disconnected, the power management module 200 is turned off to stop outputting power to the subsequent circuits and to charge the lithium battery.

The third field effect transistor VT201 is an N-channel enhancement type MOS transistor and the fourth field effect transistor VT202 is an N-channel depletion type MOS transistor, which function as switches.

Specifically, a power input terminal (corresponding to pin 5) of the lithium battery protecting chip U202 and a source electrode of the fourth field effect transistor VT202 are connected with the output terminal of the single live wire power obtaining function module 100. Specifically, the power input terminal of the lithium battery protecting chip U202 and the source electrode of the fourth field effect transistor VT202 are connected with the output terminal of three-terminal Zener diode U201 (corresponding to 3.3V)) for receiving the voltage output by the three-terminal Zener diode U201.

An output terminal of the lithium battery protecting chip U202 (corresponding to pin 1) is coupled to a gate electrode of the third field effect transistor VT201, and a source electrode of the third field effect transistor VT201 is connected with the power input terminal of the lithium battery protecting chip U202 through the seventh capacitance C203. When the lithium battery protecting chip U202 outputs a high level, the third field effect transistor VT201 is triggered to turn on.

A drain electrode of the third field effect transistor VT201 is connected to a gate electrode of the fourth field effect transistor VT202 for receiving a trigger pulse output after the third field effect transistor VT201 is turned on, so as to control the fourth field effect transistor VT202 to turn on. A drain electrode of the fourth field effect transistor VT202 is connected to a power input terminal (corresponding to pin 9) of the Bluetooth module 300. The voltage (corresponding to 3.3V) output by the three-terminal Zener diode U201 is output into a source electrode of the fourth field effect transistor VT202 through the fifth capacitance C102, the sixth capacitance C202, the third diode D201, the fourth diode D202, the fifth diode D203 and the seventh resistance R202, and then the fourth field effect transistor VT202 supplies powers to the Bluetooth module 300 and charges the lithium battery (corresponding to BAT).

Specifically, after the panel switch 10 is connected with a single live wire, the device obtains a weak power through the single live wire power obtaining function module 100. Since the current output by the single live wire power obtaining function module 100 is not enough to support the Bluetooth module 300 in the device for instant radio frequency transmission, thus the power management module 200 is added to the circuit. By pre-storing a power supply, the power supply is turned on and output to the device after meeting a power supply requirement of the back end Bluetooth module 300. When the power supply is lower than a working condition of the device after a long-term continuous operation, it will enter a protecting state; the power supply is disconnected to restore power to meet the power supply requirements of the device.

Furthermore, a signal input terminal of the Bluetooth module 300 (corresponding to pin 7) is connected with a normal opening terminal of a rotary switch 104a2 (corresponding to pin 4), another signal input terminal of the Bluetooth module 300 (corresponding to pin 8) is connected with an adjustment terminal (corresponding to pin 1) of the rotary switch 104a2, and a further signal input terminal of the Bluetooth module 300 (corresponding to pin 11) is connected with another adjustment terminal of the rotary switch 104a2 (corresponding to pin 3). The Bluetooth module 300 will obtain an adjustment instruction by rotating the rotary switch 104a2, thus to adjust the light intensity or color of the LED lamp or perform RGB switching.

Figure 8:
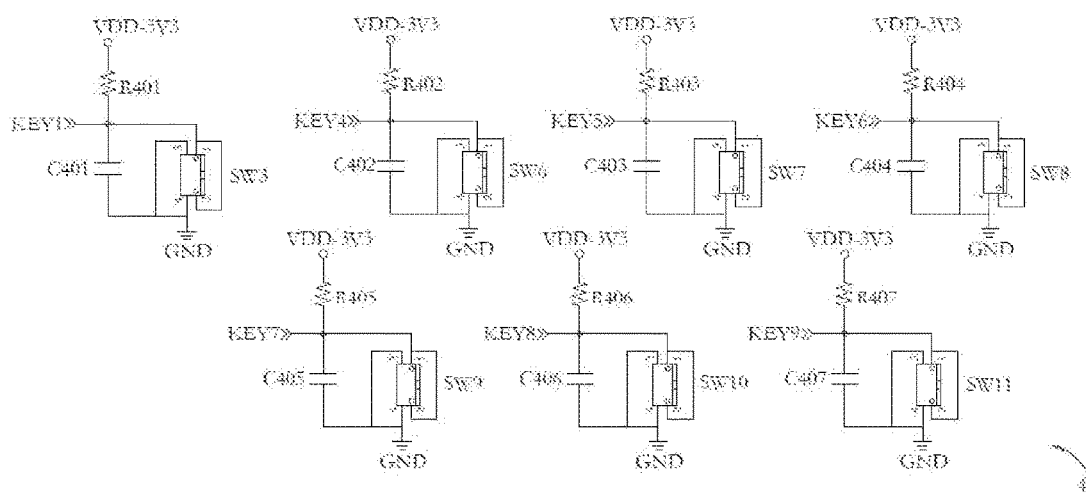
FIG. 8 is a schematic circuit view of the embodiment of a function key input module according to the present invention.
Figure 9:
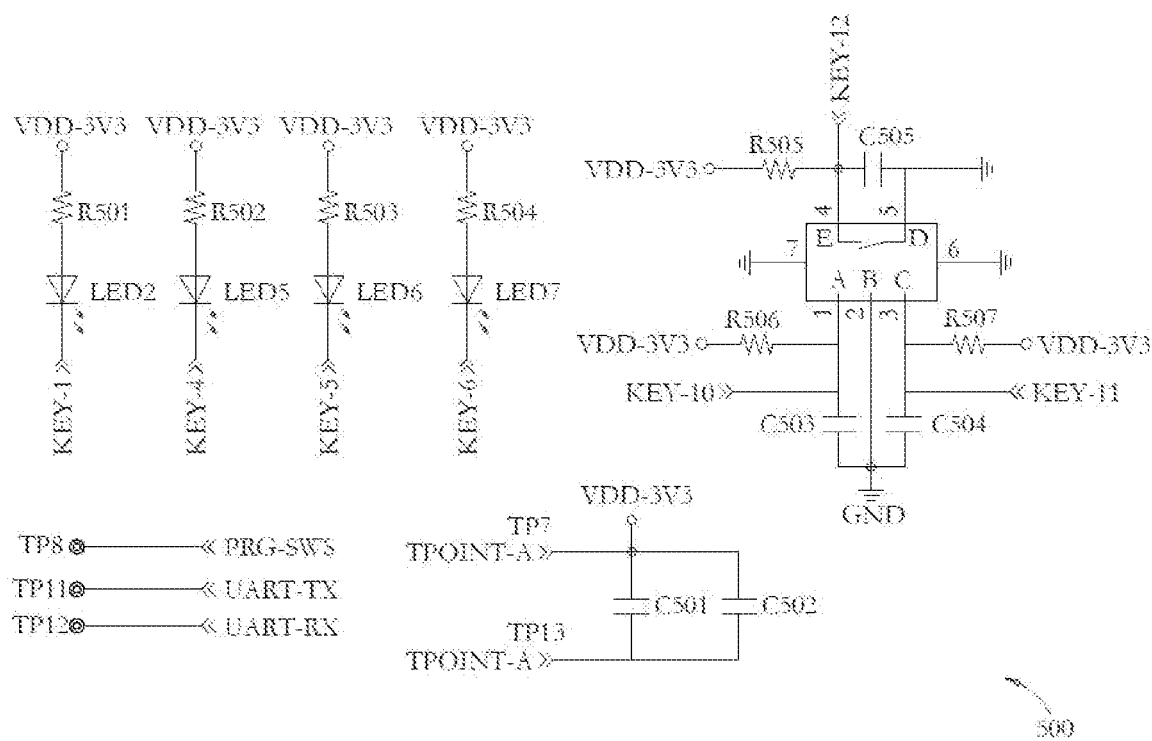
FIG. 9 is a schematic circuit view of the embodiment of a rotary switch and indicator light according to the present invention.

It should be noted that, as shown in FIG. 8, the ON key is corresponding to the key SW6, whose output terminal (corresponding to KEY4) is connected to the pin 16 of the Bluetooth module 300 for controlling ON of a panel switch display module.

The OFF key is corresponding to the key SW7, whose output terminal (corresponding to KEY5) is connected to pin 17 of the Bluetooth module 300 for controlling OFF of the panel switch display module.

The entertainment key is corresponding to the key SW8, the reading key is corresponding to the key SW9, the dining key is corresponding to the key SW10, and the timing key is corresponding to the button SW11.

In some embodiments, a wireless communication connection between the LED lamp and the external device can be established to improve the intelligence of the panel switch.

The Bluetooth module is arranged within the LED lamps, when using the APP to control and adjust the scene mode of the LED lamps, the external device is wirelessly communicated with the LED lamps; therefore the scene mode of the LED lamps can be selected or adjusted through the external device.

The embodiments of the present invention are described above with reference to the accompanying drawings, but the present invention is not limited to the above-mentioned specific embodiments. The above-mentioned specific embodiments are merely illustrative but not restrictive. Under the enlightenment of the present invention, those of ordinary skill in the art can make many forms without departing from the purposes of the present invention and the protection scope of the claims, and these all fall within the protection of the present invention.

What is claimed is:

1. An intelligent wall panel switch, comprising a switch body, a plurality of operation keys arranged on the switch body, and a controller arranged within the switch body;

wherein the controller includes a single live wire power obtaining function module, a power management module, a Bluetooth module and a function key input module;

the single live wire power obtaining function module is used for obtaining a voltage source input by a phase line and stepping down the voltage source;

an input terminal of the power management module is coupled to an output terminal of the single live wire power obtaining function module for receiving a stepped-down voltage, stabilizing and outputting the stepped-down voltage;

a power input terminal of the Bluetooth module is coupled to an output terminal of the power management module for receiving a regulated voltage, wherein the Bluetooth module establishes a wireless communication connection with LED lamps;

a signal input terminal of the Bluetooth module is connected to an output terminal of the function key input module for receiving instruction information input by the operation keys; the Bluetooth module correspondingly adjusts a scene mode of the LED lamps according to the instruction information.

2. The intelligent wall panel switch according to claim 1, wherein a rotary switch is provided at a front end of the switch body, and the rotary switch is electrically connected to the controller; when the rotary switch is rotated, the controller controls a switching of different parameters according to adjustment instructions of the rotary switch.

3. The intelligent wall panel switch according to claim 2, wherein the different parameters include at least one of light intensity, color adjustment, and RGB switching.

4. The intelligent wall panel switch according to claim 2, wherein a fixing holder is further provided within the switch body, and the rotary switch is fixed on the PCB through the fixing holder.

5. The intelligent wall panel switch according to claim 1, wherein keys are also provided at a front end of the switch body, and the keys are one-position switches, two-position switches or multi-position switches.

6. The intelligent wall panel switch according to claim 5, wherein a key switch is further provided at an upper end of the switch body, and the key switch is electrically connected to the single live wire power obtaining function module; when the key switch is turned off, the switch body is in a disconnected state.

7. The intelligent wall panel switch according to claim 1, wherein a panel fixing frame is provided on an opening side of the switch body, and the panel fixing frame is detachably connected to the switch body.

8. The intelligent wall panel switch according to claim 7, wherein locating lugs are provided at the corresponding opposite ends of the panel fixing frame, the panel fixing frame fixes the switch body on the wall through the locating lugs and screws.

9. The intelligent wall panel switch according to claim 1, wherein the single live wire power obtaining function module includes a first field effect transistor, a second field effect transistor and a drive module;

a drain electrode of the first field effect transistor is connected to an input terminal of the phase line, a source electrode of the second field effect transistor is coupled to a source electrode of the first field effect transistor, gate electrodes of the first field effect transistor and the second field effect transistor are respectively connected to a gate electrode controlling terminal of the drive module;

a drain electrode of the second field effect transistor is coupled to a drain electrode controlling terminal of the drive module.

10. The intelligent wall panel switch according to claim 9, wherein the first field effect transistor is connected to the gate electrode controlling terminal of the drive module through a third resistance;

the second field effect transistor is connected to the gate electrode controlling terminal of the drive module through a fourth resistance.

11. The intelligent wall panel switch according to claim 9, wherein the first field effect transistor and the second field effect transistor are N-channel depletion MOS transistors.

12. The intelligent wall panel switch according to claim 1, wherein the power management module includes a lithium battery protecting chip, a third field effect transistor and a fourth field effect transistor, a power input terminal of the lithium battery protecting chip and a source electrode of the fourth field effect transistor are connected to an output terminal of the single live wire power obtaining function module, an output terminal of the lithium battery protecting chip is coupled to a gate electrode of the third field effect transistor, a drain electrode of the third field effect transistor is coupled to a gate electrode of the fourth field effect transistor, and a drain electrode of the fourth field effect transistor is connected to a power input terminal of the Bluetooth module (300).

13. The intelligent wall panel switch according to claim 12, wherein the power management module further includes a seventh capacitance, wherein one end of the seventh capacitance is coupled to a source electrode of the third field effect transistor, the other end of the seventh capacitance is connected to the power input end of the lithium battery protecting chip.

14. The intelligent wall panel switch according to claim 13, wherein the third field effect transistor is an N-channel enhancement type MOS transistor, the fourth field effect transistor is an N-channel depletion MOS transistor.

15. The intelligent wall panel switch according to claim 1, wherein a Bluetooth module of the LED lamps wirelessly communicates with an external device, and scene modes of the LED lamps can be correspondingly adjusted through the external device.

* * * * *